United States Patent
Moriizumi et al.

(10) Patent No.: US 6,410,983 B1
(45) Date of Patent: Jun. 25, 2002

(54) SEMICONDUCTOR DEVICE HAVING A PLURALITY OF MULTI-CHIP MODULES INTERCONNECTED BY A WIRING BOARD HAVING AN INTERFACE LSI CHIP

(75) Inventors: Kiyokazu Moriizumi; Satoshi Osawa, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/512,657

(22) Filed: Feb. 24, 2000

(30) Foreign Application Priority Data

May 26, 1999 (JP) ............................. 11-146657

(51) Int. Cl.[7] .............................................. H01L 23/12
(52) U.S. Cl. ........................ 257/723; 257/701; 257/731
(58) Field of Search ................................ 257/731, 723, 257/701

(56) References Cited

U.S. PATENT DOCUMENTS 5,419,038 A   5/1995  Wang et al. .................. 29/830
5,789,815 A  * 8/1998  Tessier et al. ............... 257/723
6,208,521 B1 * 3/2001  Nakatsuka ................... 257/723

FOREIGN PATENT DOCUMENTS

| JP | 7-30224 | 1/1995 |
| JP | 7-66518 | 3/1995 |

* cited by examiner

Primary Examiner—Roy Potter
(74) Attorney, Agent, or Firm—Armstrong, Westerman & Hattori, LLP

(57) ABSTRACT

A plurality of multi-chip modules are incorporated in a semiconductor device. Each of the multi-chip modules has a plurality of functional parts mounted on a circuit board. A flexible wiring board connects the multi-chip modules to each other. An interface part is mounted on the flexible wiring board so as to control input and output signals of the multi-chip modules.

13 Claims, 16 Drawing Sheets

SEMICONDUCTOR DEVICE HAVING A PLURALITY OF MULTI-CHIP MODULES INTERCONNECTED BY A WIRING BOARD HAVING AN INTERFACE LSI CHIP

BACKGROUND OF THE INVENTION

1. Field of the Invention

The present invention generally relates to semiconductor devices and, more particularly, to a semiconductor device having a plurality of multi-chip modules connected to each other, each of the multi-chip modules having a plurality of input/output terminals.

2. Description of the Related Art

Recently, in the electronic equipment field, a multi-chip module (MCM) has been put into practice. The MCM comprises a thin-film circuit board which can achieve a high-density wiring and functional parts mounted on the thin-film circuit board.

FIG. 1 is a perspective view of a conventional multi-chip module (MCM). The conventional MCM 1 shown in FIG. 1 comprises an MCM board 2, a plurality of functional parts 3 and a plurality of input/output pins 4. The functional parts 3 include a CPU chip for processing data, a cache memory chip for temporarily storing processed data and an interface LSI chip for controlling the input and output of signals in the MCM 1.

Generally, the MCM board 2 of the MCM 1 has a size of a few square centimeters. The MCM board 2 is made of a ceramic material. A thin-film multi-layered circuit is formed on the ceramic material. The functional parts 3 are mounted on the MCM board 2 by means of bump connections, which enables high-density connections. The bumps are made from solder or gold. Each of the bumps has a ball-like shape having a diameter of tens of micrometers. Accordingly, a part having terminals arranged in a grid with a pitch of hundreds of micrometers can be mounted.

According to the above-mentioned structure, a wiring pattern between the MCM board 2 and the functional parts 3 can be made short so as to increase the signal transmission throughput. Thus, the MCM 1 has become popular in the electronic equipment field in which computers requiring a high-speed operation are included.

FIG. 2 is a perspective view of a printed circuit-board unit having a plurality of MCMs 1 shown in FIG. 1. In FIG. 2, the printed circuit-board unit 11 comprises a motherboard 12, a plurality of MCMs 1, a plurality of memory sockets 13 for mounting RAMs, and a plurality of I/O connectors 14 for connecting input/output cables. It should be noted that each of the MCMs 1 shown in FIG. 2 has a height greater than that shown in FIG. 1 since each of the MCMs 1 is usually provided with a heat sink mounted on the functional parts 3.

The printed circuit-board unit 11 is used as a brain of a computer system that requires high-speed data processing. As mentioned above, as computer systems have come to require a high-level function, the number of MCMs used in the printed circuit-board unit has been increasing.

If there is an MCM that satisfies a whole function alone, there is no need to provide the interconnection between the MCMs. However, in practice, such a large MCM is not favored due to low yield rates and large investment required for the manufacturing facility.

FIG. 3 is a side view of a part of the printed circuit board unit 11 shown in FIG. 2. As shown in FIG. 2, wiring patterns 26 and 27 are formed between the MCM 1-1 and the MCM 1-2 mounted on the motherboard 12 so as to interconnect the MCMs 1-1 and 1-2. The wiring patterns 26 and 27 are formed in a thick-film wiring layer formed on the motherboard 12. The signal transmission throughput between the MCMs 1-1 and 1-2 is a major factor in determining the processing capability of the system. Accordingly, lengths of the wiring patterns 26 and 27 are preferably as short as possible so as to achieve a quick signal transmission.

The path of each of the wiring patterns 26 and 27 extends between a terminal of the interface LSI chip 20-1 of the MCM 1-1 and a terminal of the interface LSI chip 20-2 of the MCM 1-2. Each of the wiring patterns 26 and 27 routes one of bumps 23-1 of the interface LSI chip 20-1, a thin-film multi-layer circuit 25-1, a through hole 28-1 of a ceramic board 24-1, one of the input/output pins 4-1, the thin-film multi-layer circuit 25 of the motherboard 12, one of the input/output pins 4-2, a through hole 28-2 of a ceramic board 24-2, a thin-film multi-layer circuit 25-2 and one of the bumps 23-2 of the interface LSI chip 20-2.

Consideration is made to the length of the wiring patterns 26 and 27 with respect to a direction (vertical direction) of the height of the MCMs 1-1 and 1-2 and a direction (horizontal direction) parallel to the mounting surface of the motherboard 12. With respect to the vertical direction, a length of each of the through holes 28-1 and 28-2 of the ceramic boards 24-1 and 24-2 must be a few millimeters, which is equal to the thickness of each of the ceramic boards 24-1 and 24-2, respectively. A length of each of the input/output pins 24-1 and 24-2 must be a few millimeters when a pin grid array (PGA) is used to absorb a distortion generated in the mounting structure between the motherboard 12 and each of the MCMs 1-1 and MCM 1-2.

With respect to the horizontal direction, the path distance between the input/output pins 4-1 of the MCM 1-1 and the input/output pins 4-2 of the MCM 1-2 to be connected to each other is determined by the wiring rule of the motherboard 12. If a distance between the terminal of the interface LSI chip 20-1 is far from the input/output pins 4-1 to be connected as shown in FIG. 3, a long wiring path must be provided.

As mentioned above, in the structure shown in FIG. 3, the wiring path between the MCM 1-1 and the MCM 1-2 must always extend through the motherboard 12. Accordingly, the length of each of the wiring patterns 26 and 27 cannot be shorter than a predetermined length.

In order to reduce the length of the wiring path between the MCMs, a structure in which the MCMs are interconnected by a flexible wiring board 30 as shown in FIG. 4 has been suggested. The flexible wiring board 30 shown in FIG. 4 is a flexible board having a high-density wiring structure formed by thin-film multi layered circuits.

In FIG. 4, each of the wiring patterns 26 and 27 shown in FIG. 3 corresponds to a total of a wiring pattern 32-1 connecting the interface LSI chip 20-1 to the flexible circuit board 30, a wiring pattern 32-2 connecting the the interface LSI chip 20-2 to the flexible circuit board 30 and a wiring pattern 31 extending through the flexible wiring board 30.

The length of the wiring pattern connecting the interface LSI chips 20-1 and 20-2 does not include the lengths of the through holes 28-1 and 28-2 of the ceramic boards 24-1 and 24-2 and the lengths of the input/output pins 4-1 and 4-1 that exist in the structure shown in FIG. 3. Thus, a length of the wiring path along the vertical direction is reduced by a few millimeters.

In the horizontal direction, there is no need to provide the wiring path from the terminal of the each of the interface LSI chips 20-1 and 20-2 to the respective one of the input/output pins 4-1 and 4-2 and the wiring path corresponding to the path in the motherboard 12. Accordingly, the wiring path is shortened by tens of millimeters.

In the structure shown in FIG. 4, the wiring pattern 32 is newly added. However, since the eliminated length of the wiring path extending in the motherboard 12 as shown in FIG. 3 is greater than the newly provided wiring pattern 32, the lengths of wiring patterns shown in FIG. 4 are shorter that that shown in FIG. 3.

However, there is a demand for further increasing the processing throughput due to continuous increase in the processing speed of computer systems. In order to further increase the processing throughput, it is required to further shorten the wiring patterns interconnecting the MCMs.

SUMMARY OF THE INVENTION

It is a general object of the present invention to provide an improved and useful semiconductor device in which the above-mentioned problems are eliminated.

A more specific object of the present invention is to provide a semiconductor device having a plurality of MCMs mutually communicating at a higher throughput rate than a conventional one by reducing the length of the signal path between the interface LSI chips of the MCMs.

In order to achieve the above-mentioned objects, there is provided according to one aspect of the present invention a semiconductor device comprising: a first multi-chip module having a plurality of functional parts mounted on a circuit board; a second multi-chip module having a plurality of functional parts mounted on a circuit board; a flexible wiring board connecting the first multi-chip module to the second multi-chip module; and an interface part mounted on the flexible wiring board, the interface part controlling input and output signals of the first multi-chip module.

According to the above-mentioned invention, a signal path for transmitting signals between the first multi-chip module and the second multi-chip module is provided by the flexible wiring board. The interface for the signals transmitted between the first multi-chip module and the second multi-chip module is provided by the interface part mounted on the flexible wiring board. Accordingly, there is no need to provide an interface part (interface LSI chip) to each of the first and second multi-chip modules. Thus, the signal path for the signals transmitted between the first multi-chip module and the second multi-chip module is reduced, resulting in an increase in the processing throughput of the semiconductor device as a whole.

Additionally, there is provided according to another aspect of the present invention a printed circuit-board unit comprising a motherboard and the above-mentioned semiconductor device mounted on the motherboard. The printed circuit-board unit according to the present invention has the same advantages as the semiconductor device according to the present invention.

Other objects, features and advantages of the present invention will become more apparent from the following detailed descriptions when read in conjunction with the accompanying drawings.

DETAILED DESCRIPTION OF THE PREFERRED EMBODIMENTS (First Embodiment)

Figure 1:
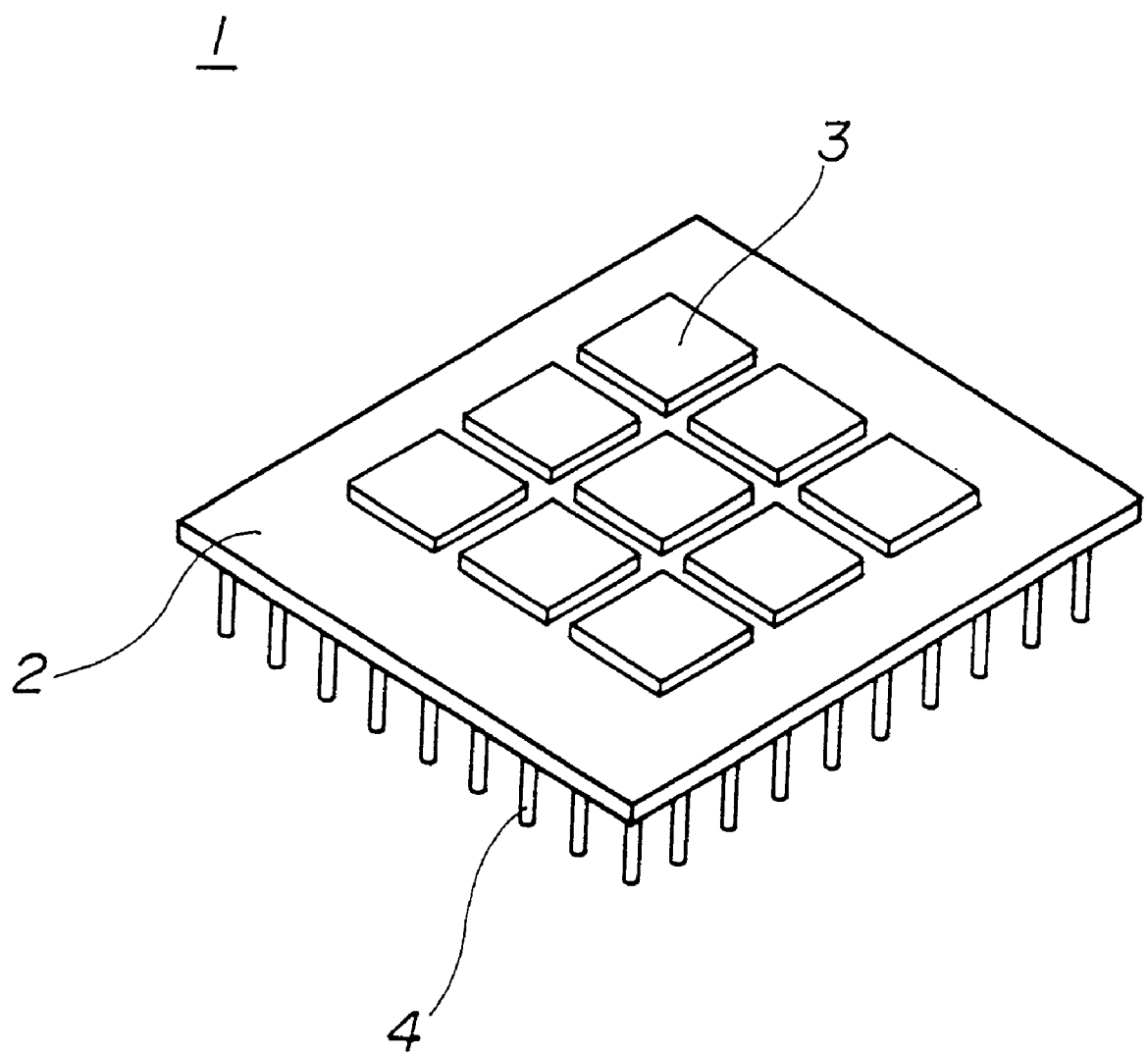
FIG. 1 is a perspective view of a conventional multi-chip module.
Figure 2:
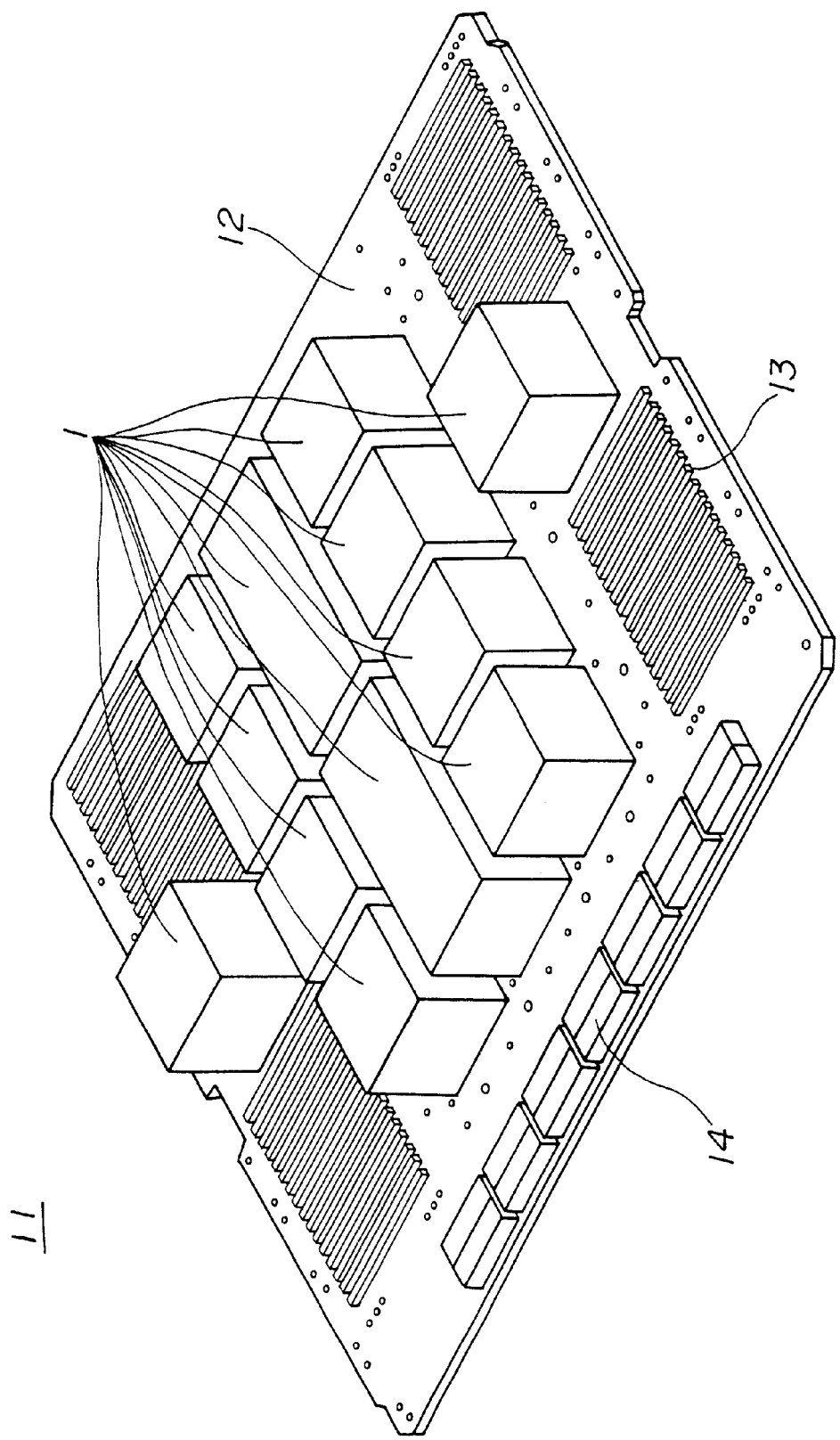
FIG. 2 is a perspective view of a printed circuit-board unit having a plurality of multi-chip modules shown in FIG. 1.
Figure 3:
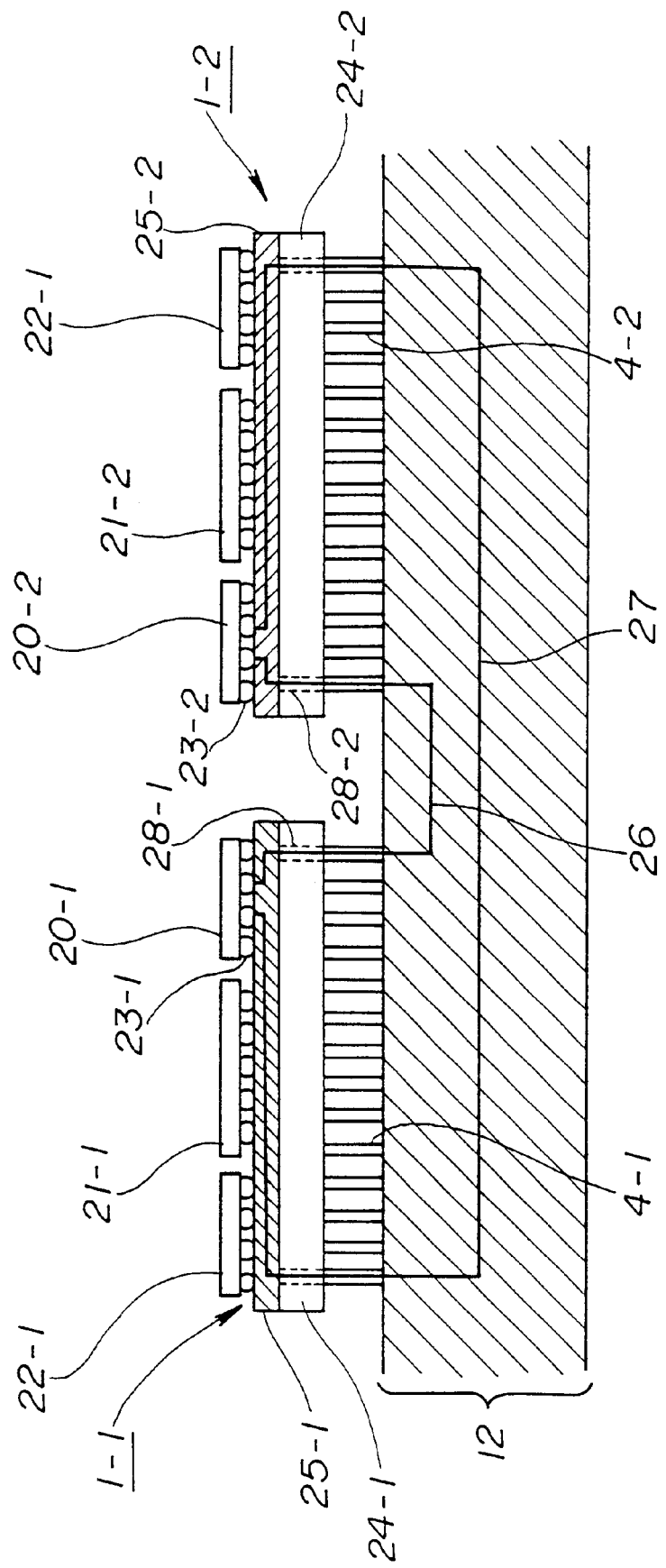
FIG. 3 is a side view of a part of the printed circuit board unit shown in FIG. 2.
Figure 4:
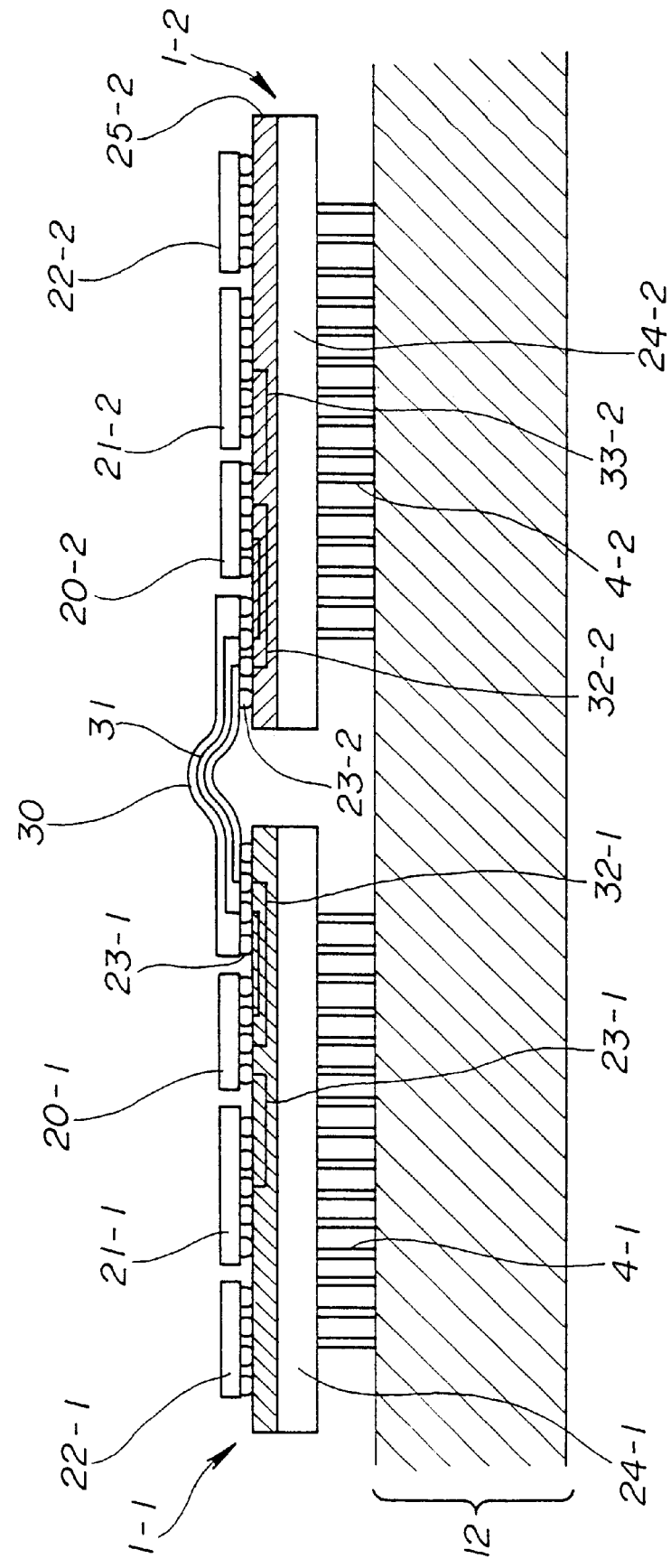
FIG. 4 is a side view of a part of another printed circuit board unit.
Figure 5:
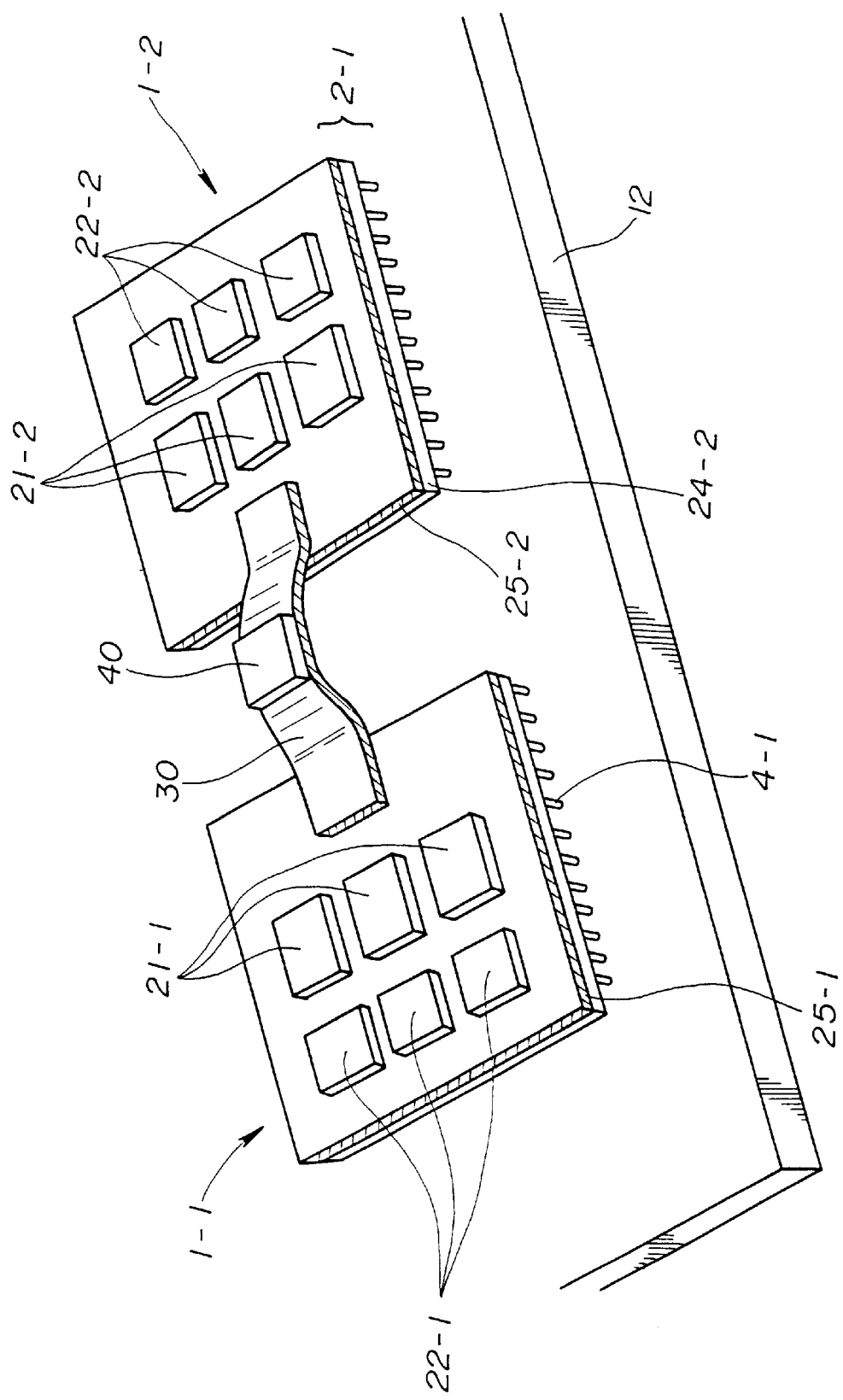
FIG. 5 is a perspective view of a part of a printed circuit-board unit having a combination module according to a first embodiment of the present invention.
Figure 6:
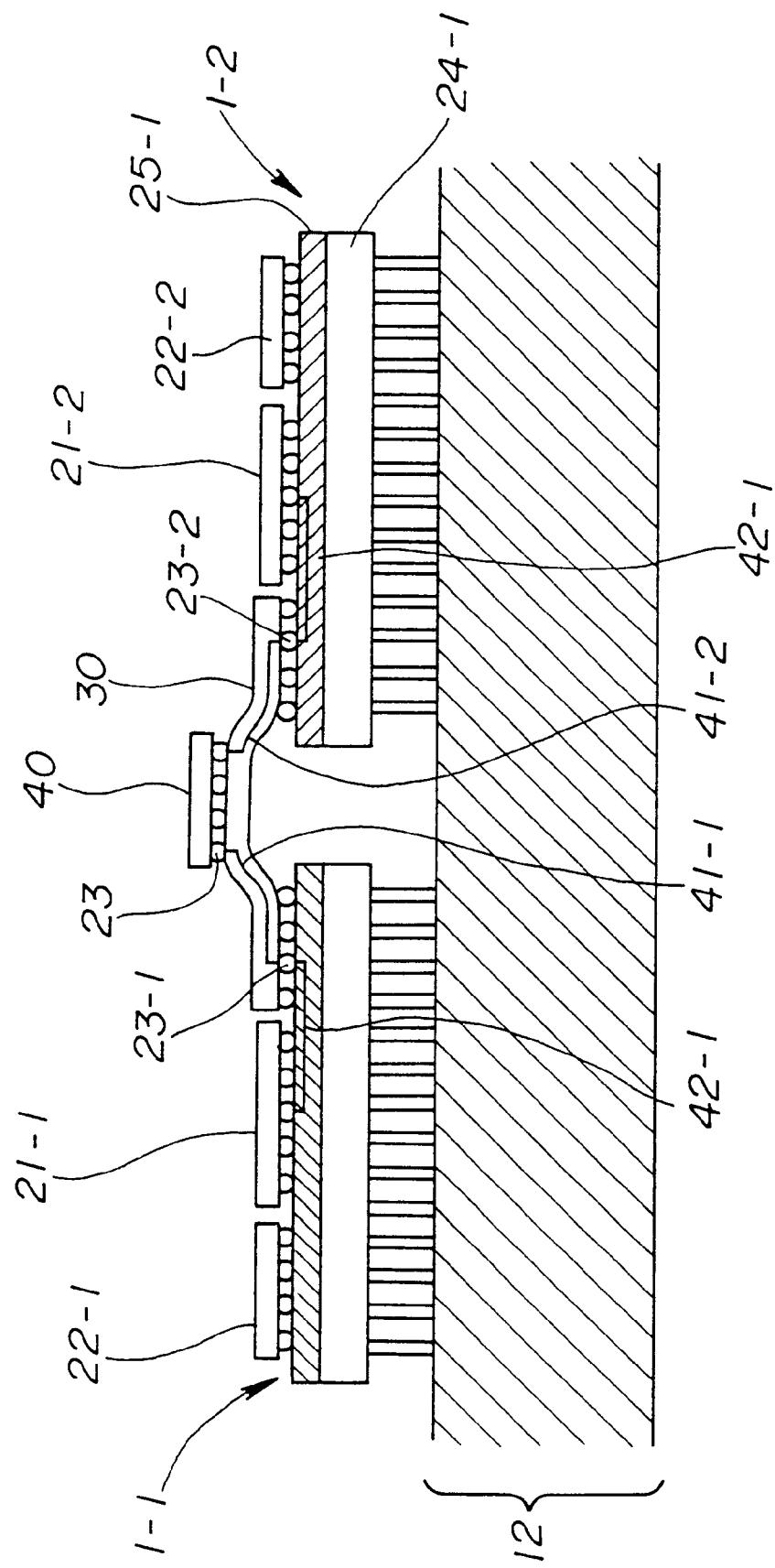
FIG. 6 is a side view of the part of the printed circuit-board unit shown in FIG.5.
Figure 7:
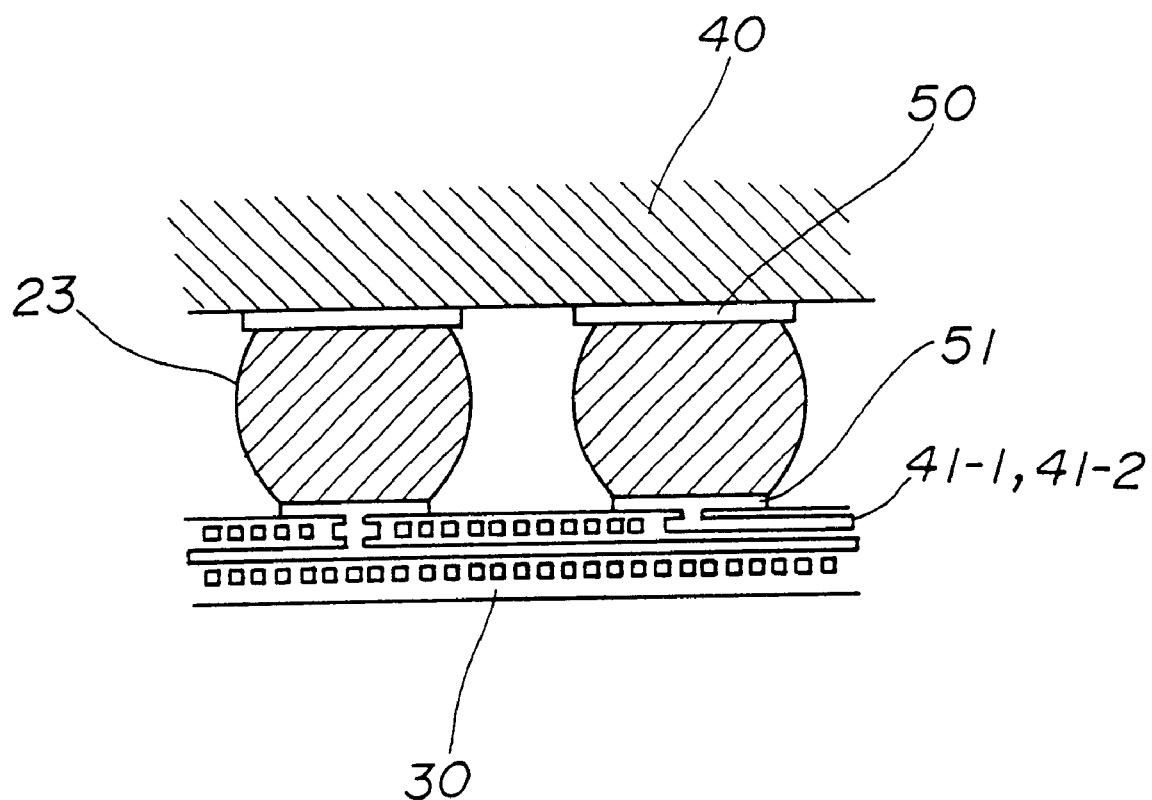
FIG. 7 is an enlarged cross-sectional view of a connecting part between an interface LSI chip and a flexible wiring board shown in FIG. 6.

A description will now be given, with reference to FIGS. 5, 6 and 7, of a first embodiment of the present invention. FIG. 5 is a perspective view of a part of a printed circuit-board unit having a combination module (semiconductor device) according to the first embodiment of the present invention. FIG. 6 is a side view of the part of the printed circuit board unit shown in FIG. 5. FIG. 7 is an enlarged cross-sectional view of a connecting part between an interface LSI chip and a flexible wiring board shown in FIG. 6. In FIGS. 5 and 6, parts that are the same as the parts shown in FIG. 4 are given the same reference numerals, and descriptions thereof will be omitted.

As shown in FIGS. 5 and 6, the MCMs 1-1 and 1-2 are mounted on the motherboard 12. The MCMs 1-1 and 1-2 are electrically connected to the motherboard 12 via the input-output pins 4-1 and 4-2, respectively. The input/output pins 4-1 and 4-2 serve to support the respective MCMs 1-1 and 1-2 on the motherboard 12.

The flexible wiring board 30 is provided over the MCM 1-1 and the MCM 1-2 so as to interconnect the MCMs 1-1 and 1-2. That is, one end of the flexible wiring board 30 is connected to the thin-film multi-layered circuit 25-1 of the MCM 1-1 and the opposite end of the flexible wiring board 30 is connected to the thin-film multi-layered circuit 25-2 of the MCM 1-2. An interface LSI chip 40 is mounted on the flexible wiring board 30. In this embodiment, the interface LSI chip 40 is mounted in the middle position of the flexible wiring board 30. However, the interface LSI chip 40 is not always mounted in the middle position of the flexible wiring board 30.

The combination module according to the first embodiment of the present invention is constituted by the MCMs 1-1 and 1-2, the flexible wiring board 30 interconnecting the MCMs 1-1 and 1-2 and the interface LSI chip 40 mounted on the flexible wiring board 30.

High-density wiring patterns 41-1 and 41-2 are provided in the flexible wiring board 30. An end of the wiring pattern 41-1 is electrically connected to the thin-film multi-layered circuit 25-1 via bumps 23-1, and the opposite end of the wiring pattern 41-1 is electrically connected to the interface LSI chip 40 via bumps 23. Similarly, an end of the wiring pattern 41-2 is electrically connected to the thin-film multi-layered circuit 25-2 via bumps 23-2, and the opposite end of the wiring pattern 41-2 is electrically connected to the interface LSI chip 40 via the bumps 23.

It should be noted that the interface LSI chip 40 serves as both the interface LSI chip 20-1 and the interface LSI chip 20-2 shown in FIG. 4. That is, the interface LSI chip of the MCM 1-1 and the interface LSI chip 20-2 of the MCM 1-2 are incorporated into the interface LSI chip 40.

Additionally, each of the MCMs 1-1 and 1-2 includes passive parts such as a resistor or a capacitor and other parts in addition to the CPU chips 21-1 and 21-2 and the cache memory chips 22-1 and 22-2.

A description will now be given of signal paths provided in the above-mentioned structure in which the MCMs 1-1 and 1-2 are interconnected via the flexible wiring board 30 on which the interface LSI chip 40 is mounted.

The MCM board 1-1 is provided with electrode pads for mounting parts. The electrode pads are connected to a wiring pattern 42-1 provided in the thin-film multi-layered circuit 25-1 and a power supply pattern (not shown in the figure). Additionally, the electrode pads are electrically connected to the terminals of the CPU chips 21-1 and the cache memory chips 22-1 via the bumps 23-1.

Most of signals transiting the wiring pattern 42-1 are supplied to the terminals of the interface LSI chip 40 via the wiring pattern 41-1. The signals supplied to the interface LSI chip 40 are controlled by the interface LSI chip 40 and are output to the MCM 1-2 via the terminals of the interface LSI chip 40.

The MCM 1-2 has the same structure as the MCM 1-1, and descriptions thereof will be omitted.

As mentioned above, the interface LSI chip 40 has both the function of the interface LSI chip of the MCM 1-1 and the function of the interface LSI chip of the MCM 1-2. Accordingly, the function of the wiring pattern between the interface LSI chips 20-1 and 20-2 shown in FIG. 4 is provided by an internal wiring pattern of the interface LSI chip 40. Accordingly, the wiring pattern between the interface LSI chips 20-1 and 20-2 is not seen in FIG. 6.

According to the above-mentioned structure, the signal path of the MCM 1-1 includes two paths. One is for transmitting signals between the MCMs 1-1 and 1-2, and the other is for transmitting signals between the MCM 1-1 and external units such as an operational panel or an external memory.

The signal path for transmitting signals from the MCM 1-1 to the external unit starts from the terminal of the interface LSI chip 40 and passes through the thin-film multi-layered circuit 25-1, the through holes 28-1 of the ceramic board 24-1 and the input/output pin 4-1 of the MCM 1-1, and reaches the thick-film wiring of the motherboard 12. The above-mentioned signal path (wiring path) is not show in FIG. 6 for the sake of convenience.

It should be noted that the signal paths provided in the MCM 1-2 are the same as those of the MCM 1-1 described above, and descriptions thereof will be omitted.

It should be noted that the interface LSI chips 20-1 and 20-2 may be separately provided on the flexible wiring board 30 instead of incorporating the two interface LSI chips 20-1 and 20-2 into the interface LSI chip 40. Alternatively, the interface LSI chip 40 may have only a function to control the input and output signals of one of the MCMs 1-1 and 1-2.

Comparing the structure shown in FIG. 6 with the conventional structure shown in FIG. 4, the interface LSI chips 20-1 and 20-2 are moved from the position on the MCM boards 2-1 and 2-2 to the position on the flexible wiring board 30, respectively, and the parts on the MCM boards 2-1 and 2-2 are positioned close to each end of the flexible wiring board 30 in the present embodiment. Accordingly, the length of the wiring patterns 33-1 and 33-2 shown in FIG. 4 is approximately equal to the length of the wiring pattern 42-1 and 42-2 which correspond to the wiring pattern 33-1 and wiring pattern 33-2, respectively.

Accordingly, the path corresponding to the wiring patterns 32-1 and 32-2 is eliminated in the structure of the present embodiment. More specifically, the path length is reduced by approximately twice the length of a side of the interface LSI chip 20-1 or 20-2.

In the present embodiment, since a mounting area of the MCM can be reduced, the size of the MCM board can be reduced. Thereby, the size of the printed circuit-board unit can be reduced, and the yield rate improved.

Additionally, as shown in FIG. 5, the flexible wiring board 30 is slightly longer than the distance between the MCMs 1-1 and 1-2. That is, the flexible wiring board 30 is slightly bent so as to absorb an offset in positions of the MCMs 1-1 and 1-2.

(Second Embodiment)

Figure 8:
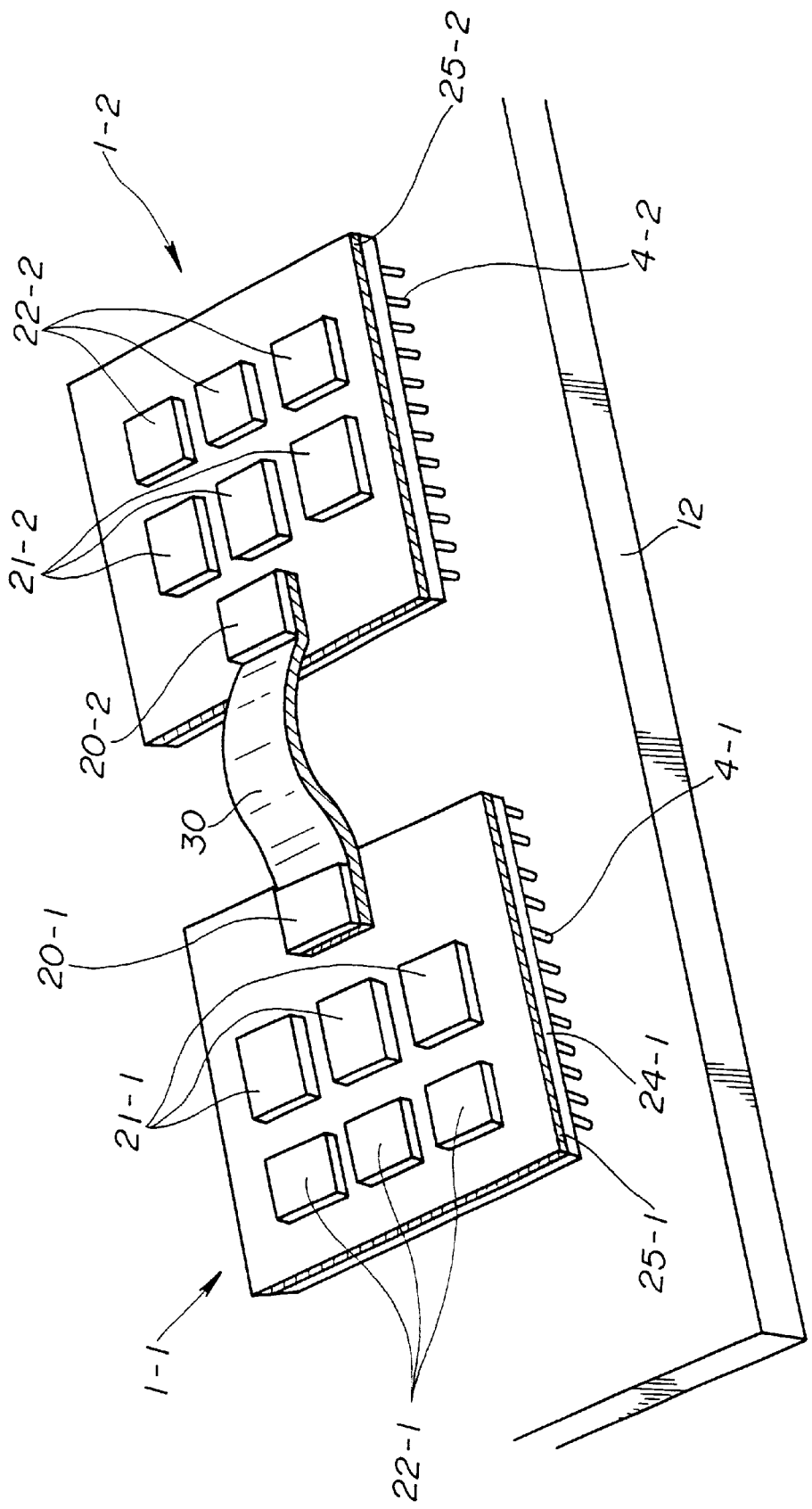
FIG. 8 is a perspective view of a part of a printed circuit-board unit having a combination module according to a second embodiment of the present invention.
Figure 9:
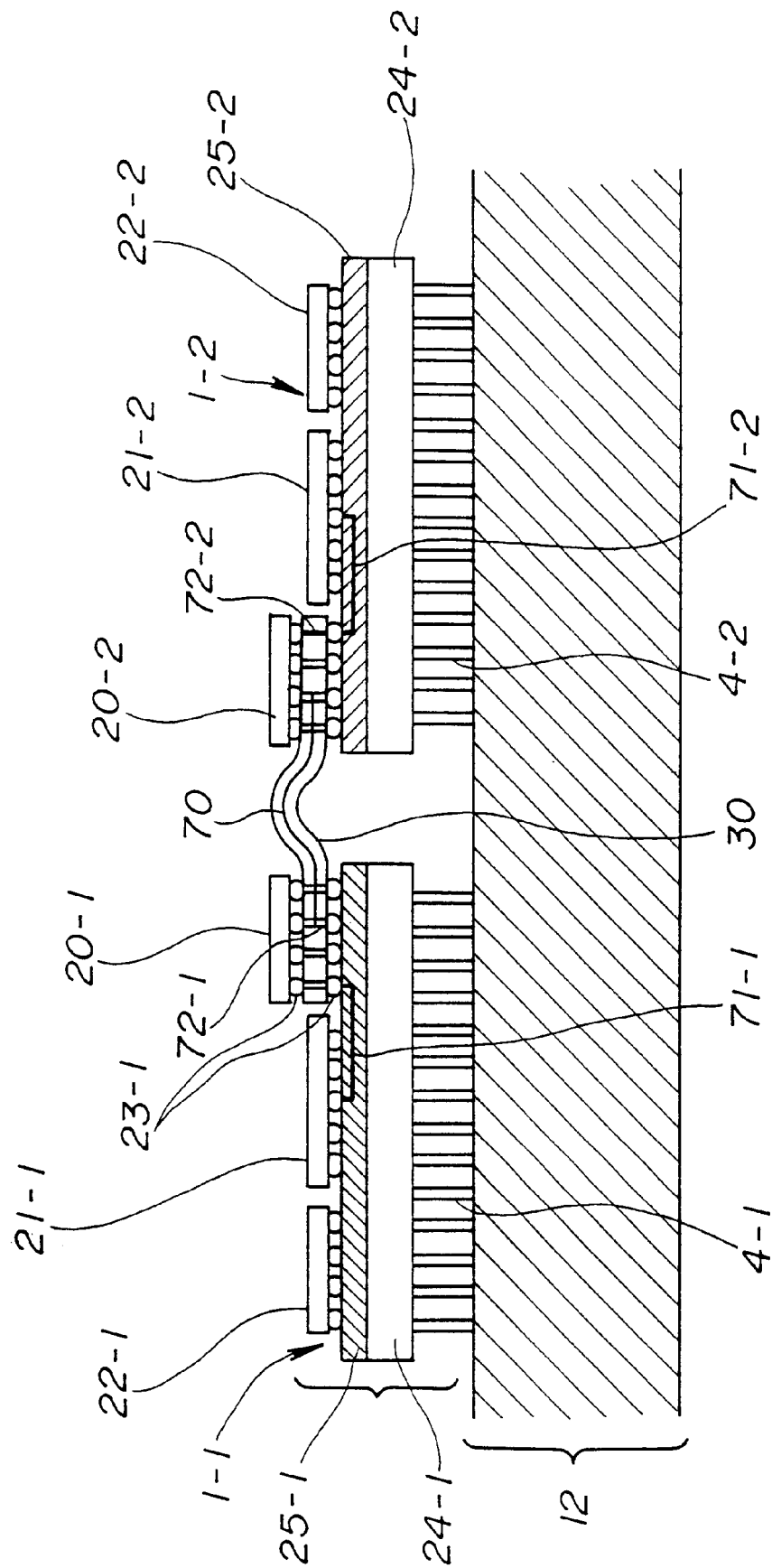
FIG. 9 is a side view of the part of the printed circuit-board unit shown in FIG.8.
Figure 10:
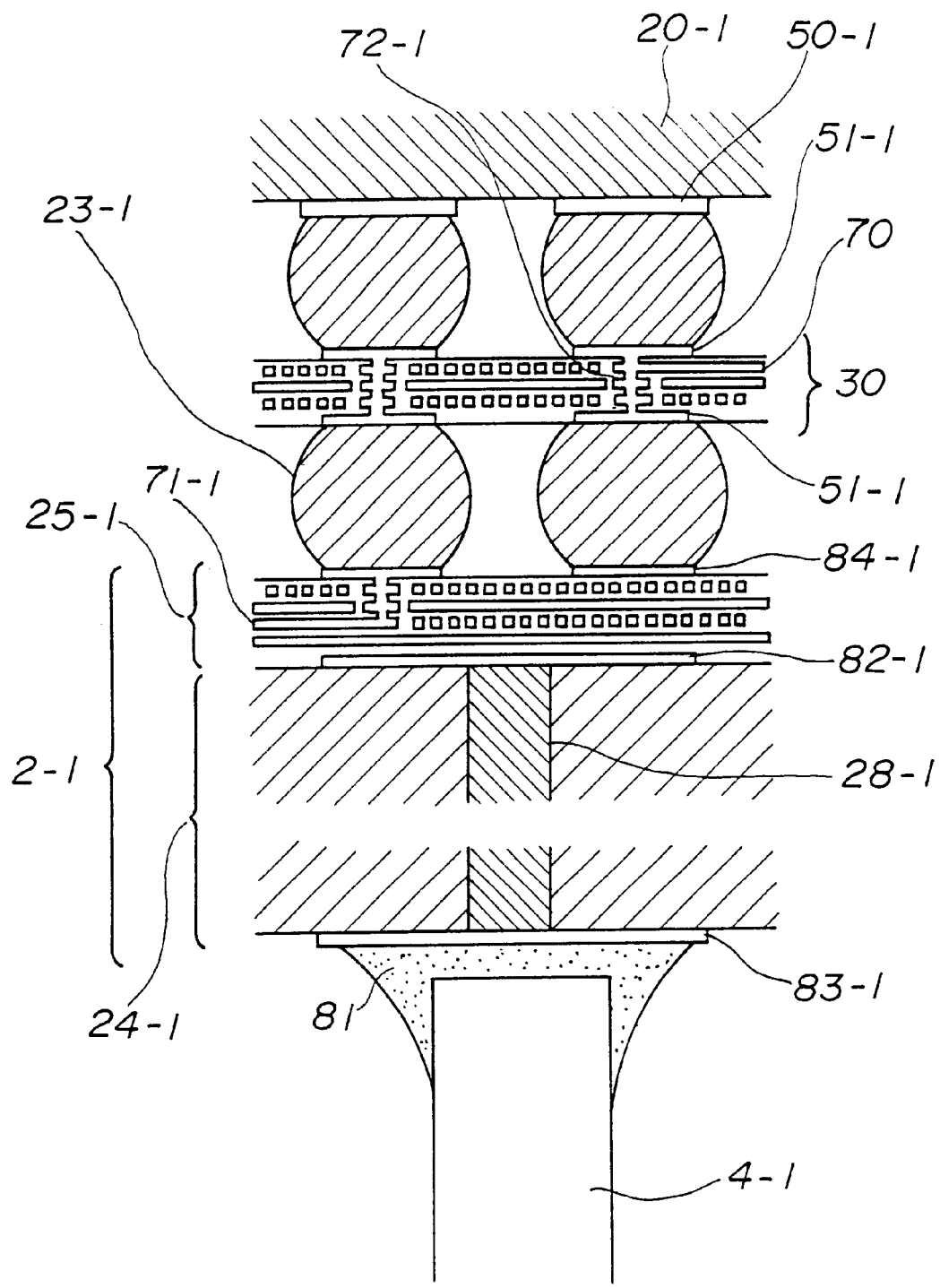
FIG. 10 is an enlarged cross-sectional view of a connecting part between an interface LSI chip and a flexible wiring board shown in FIG. 9.

A description will now be given, with reference to FIGS. 8, 9 and 10, of a second embodiment of the present invention. FIG. 8 is a perspective view of a part of a printed circuit-board unit having a combination module according to the second embodiment of the present invention. FIG. 9 is a side view of the part of the printed circuit-board unit shown in FIG. 8. FIG. 10 is an enlarged cross-sectional view of a connecting part between an interface LSI chip and a flexible wiring board shown in FIG. 9. In FIGS. 8 and 9, parts that are the same as the parts shown in FIGS. 5 and 6 are given the same reference numerals, and descriptions thereof will be omitted.

The combination module unit according to the second embodiment of the present invention has the same structure as the combination module according to the first embodiment of the present invention except for the interface LSI chips 20-1 and 20-2 provided on opposite ends of the flexible wiring board 30, respectively, instead of the interface LSI chip 40. That is, the interface LSI chip 40 according to the first embodiment of the present invention is replaced by the interface LSI chips 20-1 and 20-2.

As shown in FIG.9, the interface LSI chip 20-1 is mounted on the MCM 1-1 with the flexible wiring board 30 therebetween. The interface LSI chip 20-1 is electrically connected to the thin-film multi-layered circuit 25-1 of the MCM board 1-1 via the solder bumps 23-1.

An end part of the flexible wiring board 30 interposed between the interface LSI chip 20-1 and the MCM board 1-1 is provided with through holes 72-1 that connects electrode pads 51-1 provided on the front surface of the flexible wiring board 30 to electrode pads 51-1 provided on the rear surface of the flexible wiring board 30 as shown in FIG. 10. Additionally, the flexible wiring board 30 is provided with a high-density wiring pattern 70 which extends from an end of the flexible wiring board 30 to the opposite end of the flexible wiring board 30 so as to electrically connect the interface LSI chips 20-1 and 20-2 to each other. Specifically, the wiring pattern 70 electrically connects the through holes 72-1 on the MCM 1-1 side to the through holes 72-2 on the MCM 1-2 side.

As shown in FIG. 10, the pads 51-1 provided on the front surface of the flexible wiring board 30 are connected to pads 50-1 of the interface LSI chip 20-1 via the solder bumps 23-1. The pads 51-1 on the front surface of the flexible wiring board 30 are electrically connected to the pads 51-1 provided on the rear surface of the flexible wiring board 30. The pads 51-1 provided on the rear surface of the flexible wiring board 30 are connected to electrode pads 84-1 provided on the surface of the thin-film multi-layered circuit 25-1 of the MCM board 2-1.

Electrode pads 82-1 provided on the ceramic board 24-1 are connected to respective electrode pads 83-1 provided on the opposite surface of the ceramic board 24-1 by respective through holes 28-1. The input-output pins 4-1 are connected to the electrode pad 83-1 by solder 81.

As mentioned above and shown in FIGS. 8 and 9, the interface LSI chip 20-1 is situated directly above the end part of the flexible wiring board 30, which part is connected to the MCM board 1-1. The terminals of the interface LSI chip 20-1 are connected to a wiring pattern 71-1 of the thin-film multi-layered circuit 25-1 with a low impedance.

It should be noted that the MCM 1-2 has the same structure as the MCM 1-1, and descriptions of each parts of the MCM 1-2 will be omitted.

A description will now be given of a signal path of the MCM 1-1.

Most of internal signals of the MCM 1-1 are supplied to external devices via the interface LSI chip 20-1. The signals output from the MCM 1-1 include signals supplied to external devices and signals supplied to the MCM 1-2.

The signal path (not indicated in FIG. 9) for transmitting the signals supplied to external devices other than the MCM 1-2 starts from the terminals of the interface LSI chip 20-1 and reaches thick film wiring pattern of the motherboard 12 via the through holes 72-1 of the flexible wiring board 30, the thin-film multi-layered circuit 25-1, the through holes of the ceramic board 24-1 and the input/output pins 4-1.

The signal path of the MCM 1-1 for transmitting the signals supplied to the MCM 1-2 corresponds to the wiring pattern 70 provided in the flexible wiring board 30, and is indicated by a bold line in FIG. 9.

It should be noted that the signal paths of the MCM 1-2 are the same as that of the MCM 1-1, and descriptions thereof will be omitted.

(Third Embodiment)

Figure 11:
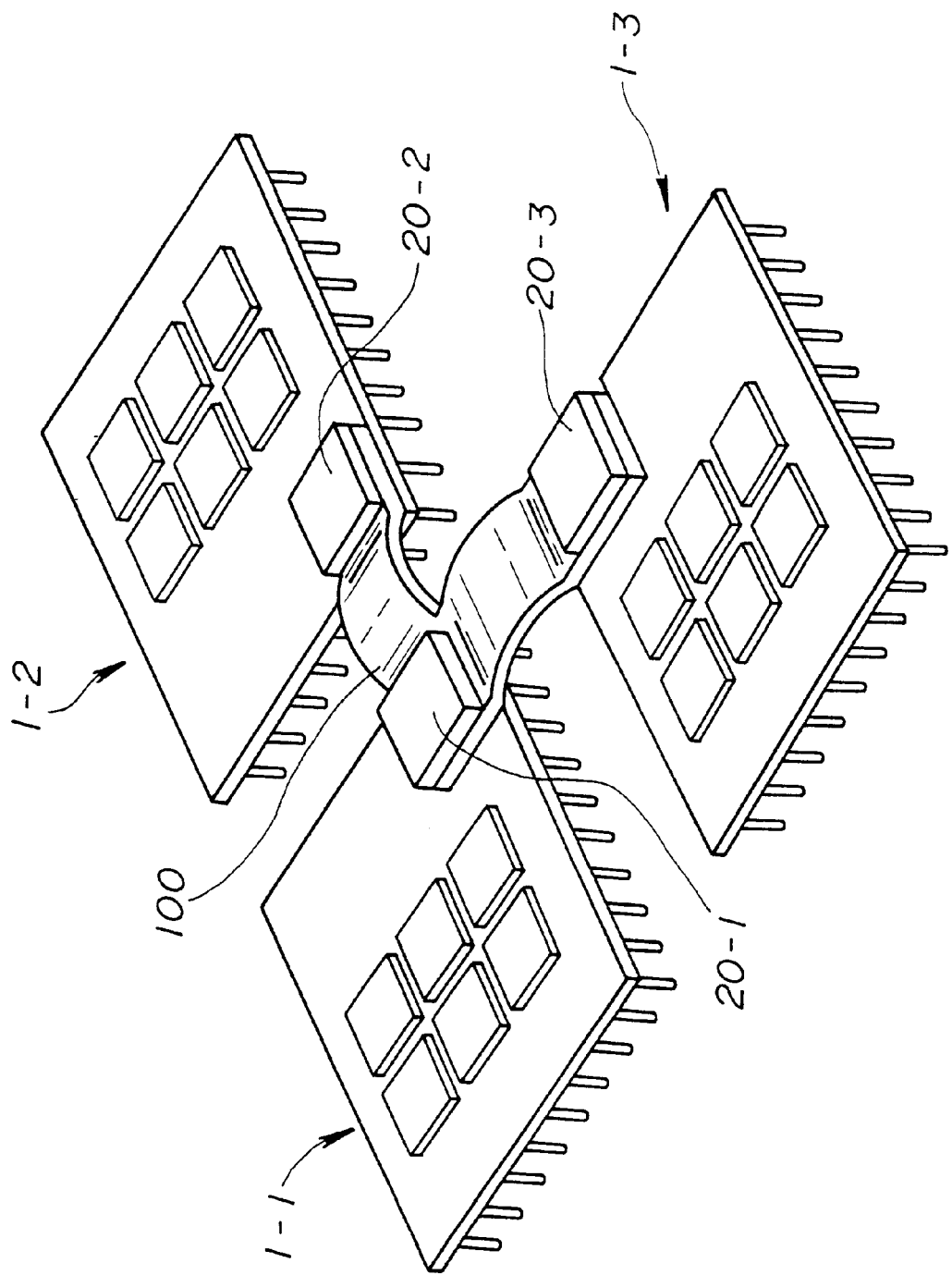
FIG. 11 is a perspective view of a combination module according to a third embodiment of the present invention.

A description will now be given, with reference to FIG. 11, of a third embodiment of the present invention. FIG. 11 is a perspective view of a combination module according to the third embodiment of the present invention.

As shown in FIG. 11, the combination module according to the third embodiment of the present invention is provided with an MCM 1-3 in addition to the MCMs 1-1 and 1-2 provided in the second embodiment described above. Accordingly, the flexible wiring board 30 of the second embodiment is replaced by a flexible wiring board 100.

Since the three MCMs 1-1, 1-2 and 1-3 are provided in this embodiment, the flexible wiring board 100 has an L-shape so that the MCM 1-1 is connected to both the MCM 1-2 and MCM 1-3. That is, a first part of the flexible wiring board 100 extends from the MCM 1-1 to the MCM 1-2 in the same structure as the flexible wiring board 30 of the second embodiment, and a second part of the flexible wiring board 100 extends from the MCM 1-1 to the MCM 1-3 in the same structure as the flexible wiring board 30 of the second embodiment. An angle formed by the first part and the second part is approximately 90 degrees.

According to the flexible wiring board 100 having the above-mentioned structure, first the flexible wiring circuit 100 is connected to the MCM 1-1. Thereafter, the end of the first part is connected to the MCM 1-2, and, then, the end of the second part is connected to the MCM 1-3. The first part and the second part are bent in the same manner as the flexible wiring board 30 of the second embodiment. The interface LSI chips 20-1, 20-2 and 20-3 are mounted on portions of the flexible wiring board 100 connected the respective MCMs 1-1, 1-2 and 1-3.

When three MCMs are to be connected, one possibility is to connect the three MCMs in a triangular shape so that one of the MCM can directly communicate with the remaining two MCMs. In such a case, the flexible wiring board 100 may be formed in a triangular shape so that the MCMs are connected at respective corners of the triangular shape. Alternatively, the flexible wiring board may be formed in a Y-shape so that the MCMs are connected on respective ends of the Y-shape.

If the flexible wiring board 100 is formed in a triangular shape, when two corners are connected to the respective MCMs, a portion of the flexible wiring board having a triangular shape is bent in the same manner as the flexible wiring board 30 of the second embodiment so as to absorb an excessive length. The bend in this portion may cause a roll-up or roll-down of a portion near the remaining corner of the flexible wiring board. In such a case, a large force is required to connect the remaining corner to the remaining MCM, which results in generation of a large stress in the connecting parts between the flexible wiring board and the MCMs and the connecting parts between the flexible wiring board and the mother board. Accordingly, the flexible wiring board having a triangular shape may cause a problem with respect to difficulty in the fabrication process and reliability of a completed product. The above-mentioned problem also occurs if the flexible wiring board is formed in a Y-shape.

However, in the present embodiment, the flexible wiring board 100 has an L-shape as shown in FIG. 11, which shape eliminates the above-mentioned problem related to the flexible wiring board having a triangular shape or a Y-shape.

The flexible wiring board 100 is provided with internal wiring patterns in the first part extending toward the MCM 1-2 and the second part extending toward the MCM 1-3. The MCM 1-1 communicates with the MCM 1-2 via the internal wiring pattern provided in the first part, and the MCM 1-1 also communicates with the MCM 1-3 via the internal wiring pattern provided in the second part. Additionally, the MCM 1-2 is directly communicable with the MCM 1-3 via the internal wiring pattern continuously extending from the MCM 1-2 to the MCM 1-3. Since the flexible wiring board 100 has a structure in which a thin-film multi-layered circuit is formed, a high-density wiring can be achieved which enables formation of many wiring patterns within the flexible wiring board.

(Fourth Embodiment)

Figure 12:
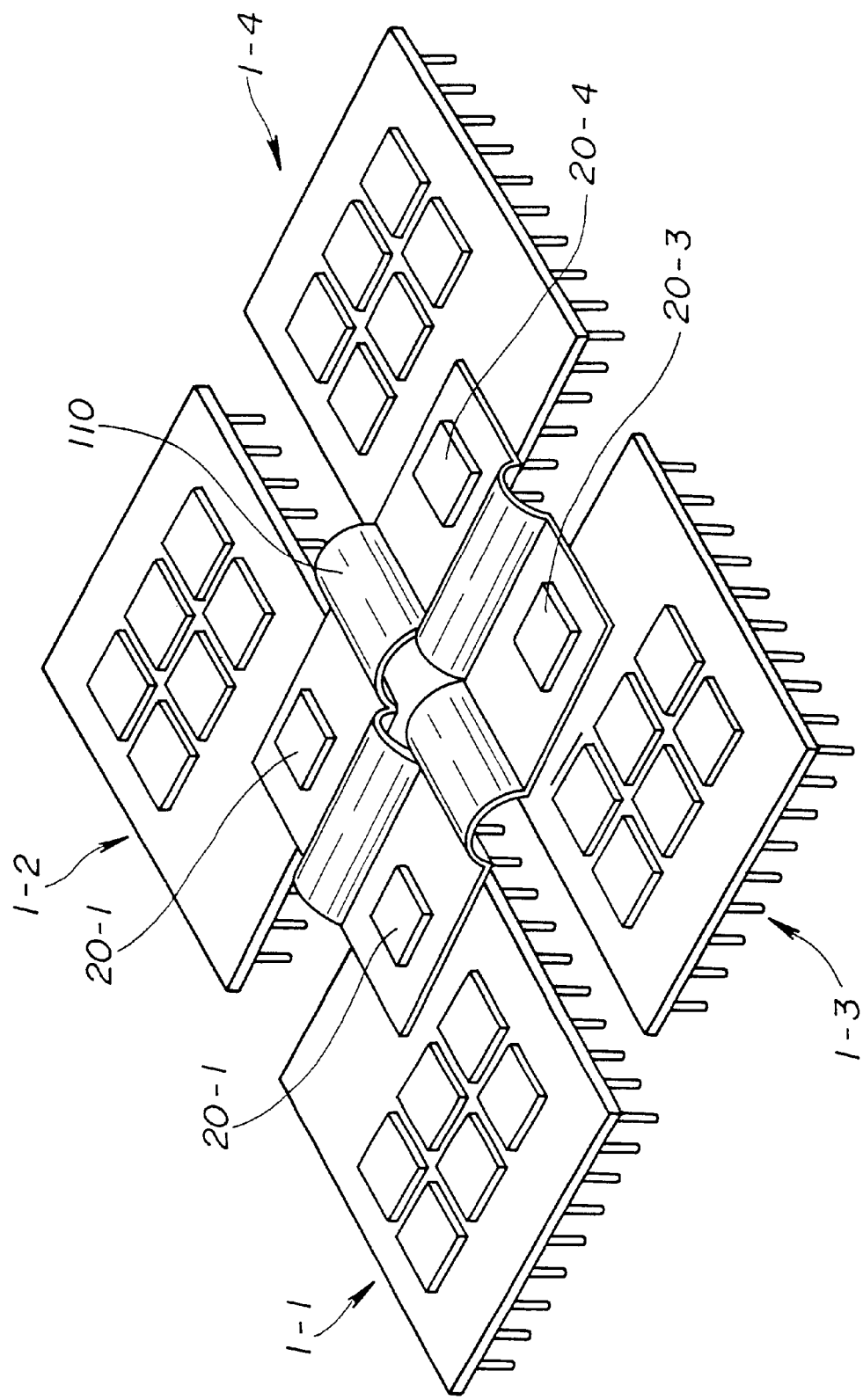
FIG. 12 is a perspective view of a combination module according to a fourth embodiment of the present invention.

A description will now be given, with reference to FIG. 12, of a fourth embodiment of the present invention. FIG. 12 is a perspective view of a combination module according to the fourth embodiment of the present invention.

As shown in FIG. 12, the combination module according to the fourth embodiment of the present invention is provided with an MCM 1-4 in addition to the MCMs 1-1, 1-2 and 1-3 provided in the third embodiment described above. Accordingly, the flexible wiring board 100 of the third embodiment is replaced by a flexible wiring board 110.

Since the four MCMs 1-1, 1-2, 1-3 and 1-4 are provided in this embodiment, the flexible wiring board 110 has a square shape so that the MCMs 1-1, 1-2, 1-3 and 1-4 are connected to the respective corners of the square shape and the interface LSI chips 20-1, 20-2, 20-3 and 20-4 are mounted on the respective corners. In the flexible wiring board 110 shown in FIG. 12, a square opening is provided in the center of the flexible wiring board 110 so as to eliminate the problem described in relation to the third embodiment, that is, to reduce a stress caused by bending portions of the flexible wiring board 110 between the MCMs 1-1, 1-2, 1-3 and 1-4.

Figure 13:
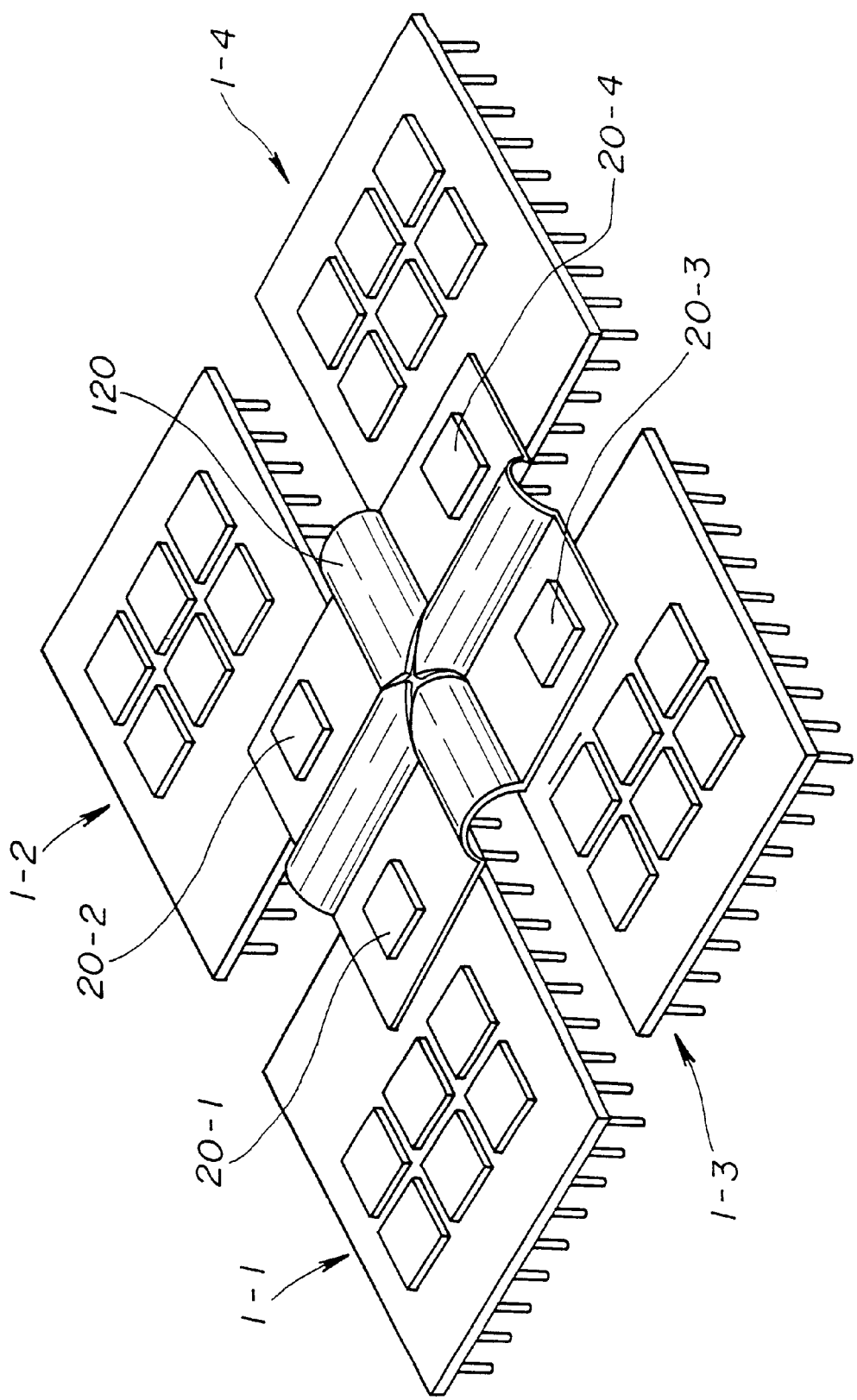
FIG. 13 is a perspective view of a variation of the combination module according to the fourth embodiment of the present invention.

The flexible wiring board 110 can be replaced by a flexible wiring board 120 shown in FIG. 13. The flexible wiring board 120 has a cross-shaped slit in the center thereof instead of the square opening of the flexible wiring board 110 so as to reduce a stress caused by bending portions between the MCMs 1-1, 1-2, 1-3 and 1-4.

It should be noted that the bent portions between the MCMs 1-1, 1-2, 1-3 and 1-4 can be bent upwardly as shown in FIGS. 12 and 13, or can be bent in the reverse direction.

In the structure shown in FIGS. 12 and 13, each of the interface LSI chips 20-1, 20-2, 20-3 and 20-4 corresponding to the respective MCMs 1-1, 1-2, 1-3 and 1-4 is directly connected to each of the other interface LSI chips via internal wiring patterns provided in the flexible wiring board 110 or 120.

The structure according to the fourth embodiment in which four MCMs are provided may be applied to the following example in which the an additional function is provided to one of the functional parts which controls input and output signals. The additional function may includes a function to monitor the operational state of each of the MCMs, a function to interface instructions provided from the motherboard to each of the MCMs and a function to average net working rates of the MCMs. By providing such an additional function, the printed circuit-board unit can be effectively operated, and, thereby, heat generated by the MCMs can be equalized and the processing ability of the entire printed circuit-board unit can be increased.

(Fifth Embodiment)

Figure 14:
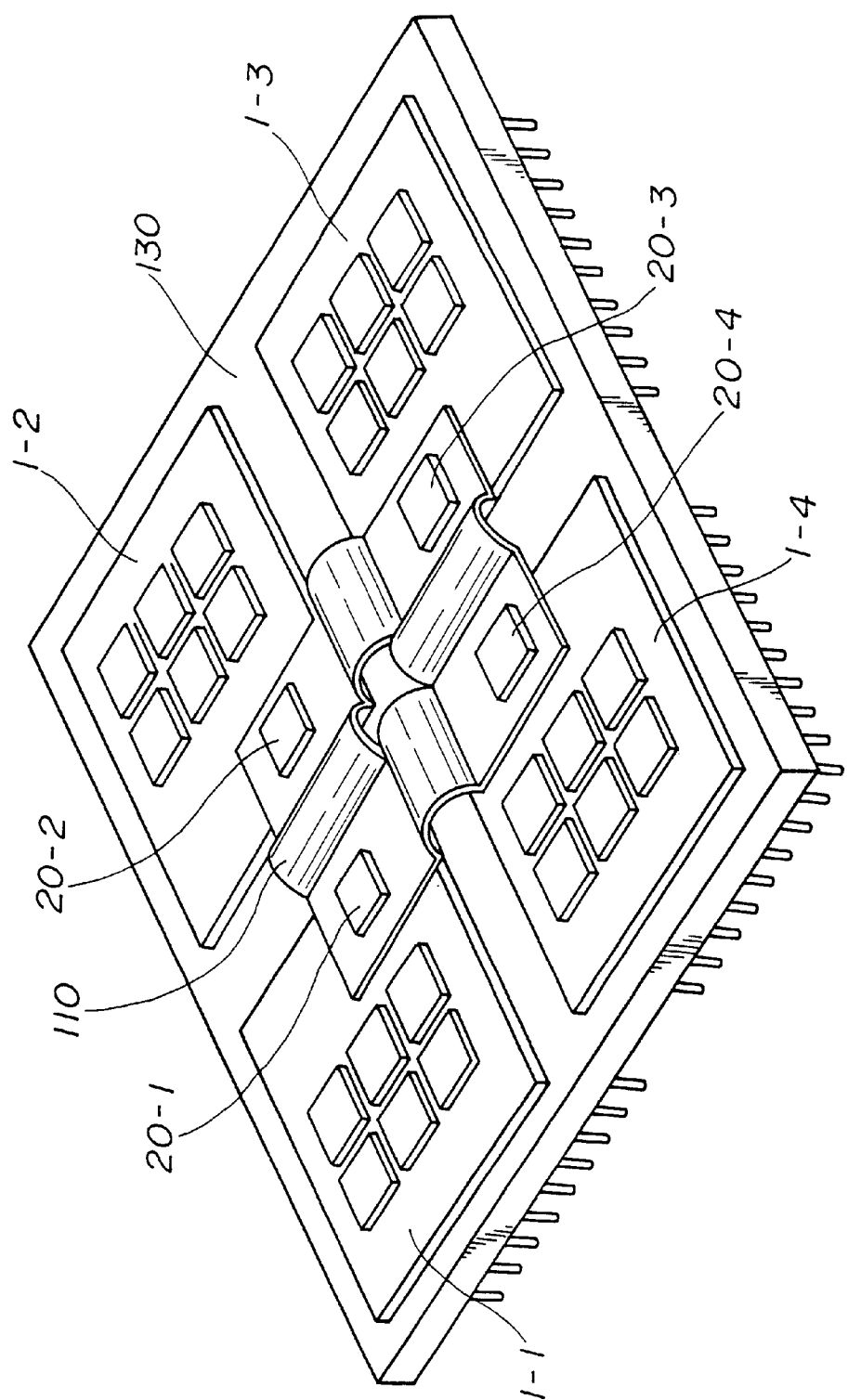
FIG. 14 is a perspective view of a combination module according to a fifth embodiment of the present invention.
Figure 15:
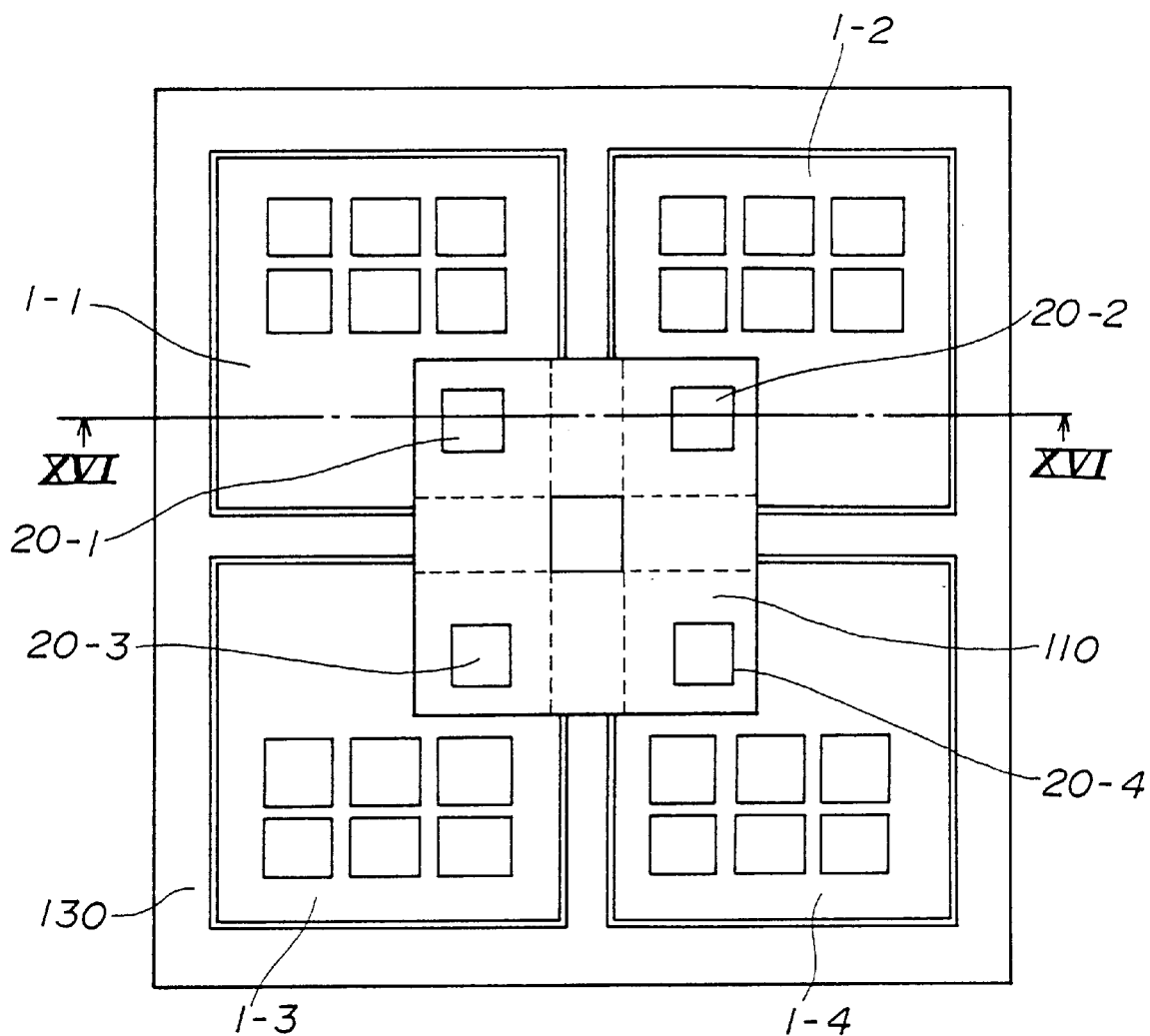
FIG. 15 is a plan view of the combination module shown in FIG. 14.
Figure 16:
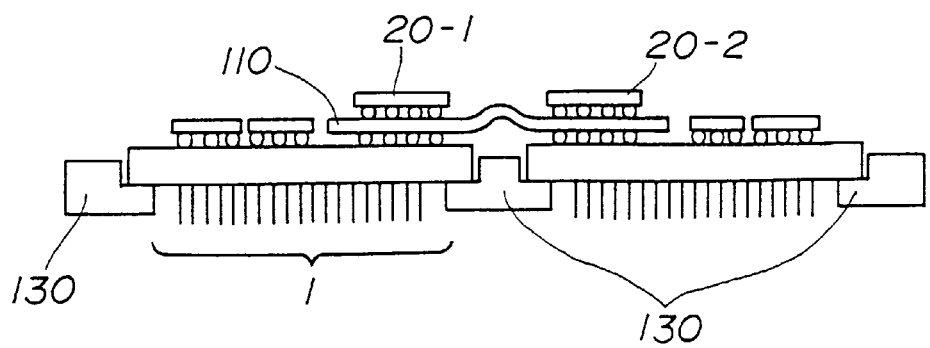
FIG. 16 is a cross-sectional view of the combination module shown in FIG. 15 taken along a line XVI—XVI.

A description will now be given, with reference to FIGS. 14, 15 and 16, of a fifth embodiment of the present invention. FIG. 14 is a perspective view of a combination module according to the fifth embodiment of the present invention. FIG. 15 is a plan view of the combination module shown in FIG. 14. FIG. 16 is a cross-sectional view of the combination module shown in FIG. 15 taken along a line XVI—XVI.

In this embodiment, the four MCMs 1-1, 1-2, 1-3 and 1-4 of the above-mentioned fourth embodiment are combined together by a frame 130. That is, each of the MCMs 1-1, 1-2, 1-3 and 1-4 are supported by the frame 130 at predetermined positions. The frame 130 has four square openings each of which holds the respective one of the MCMs 1-1, 1-2, 1-3 and 1-4 that are connected by the flexible wiring board 110 or 120 in the same manner as that of the fourth embodiment. The MCMs 1-1, 1-2, 1-3 and 1-4 situated in the respective openings are fixed to the frame 130 by an adhesive so that the MCMs 1-1, 1-2, 1-3 and 1-4 connected to each other by the flexible wiring board 110 or 120 can be handled as a single module.

(Sixth Embodiment)

Figure 17:
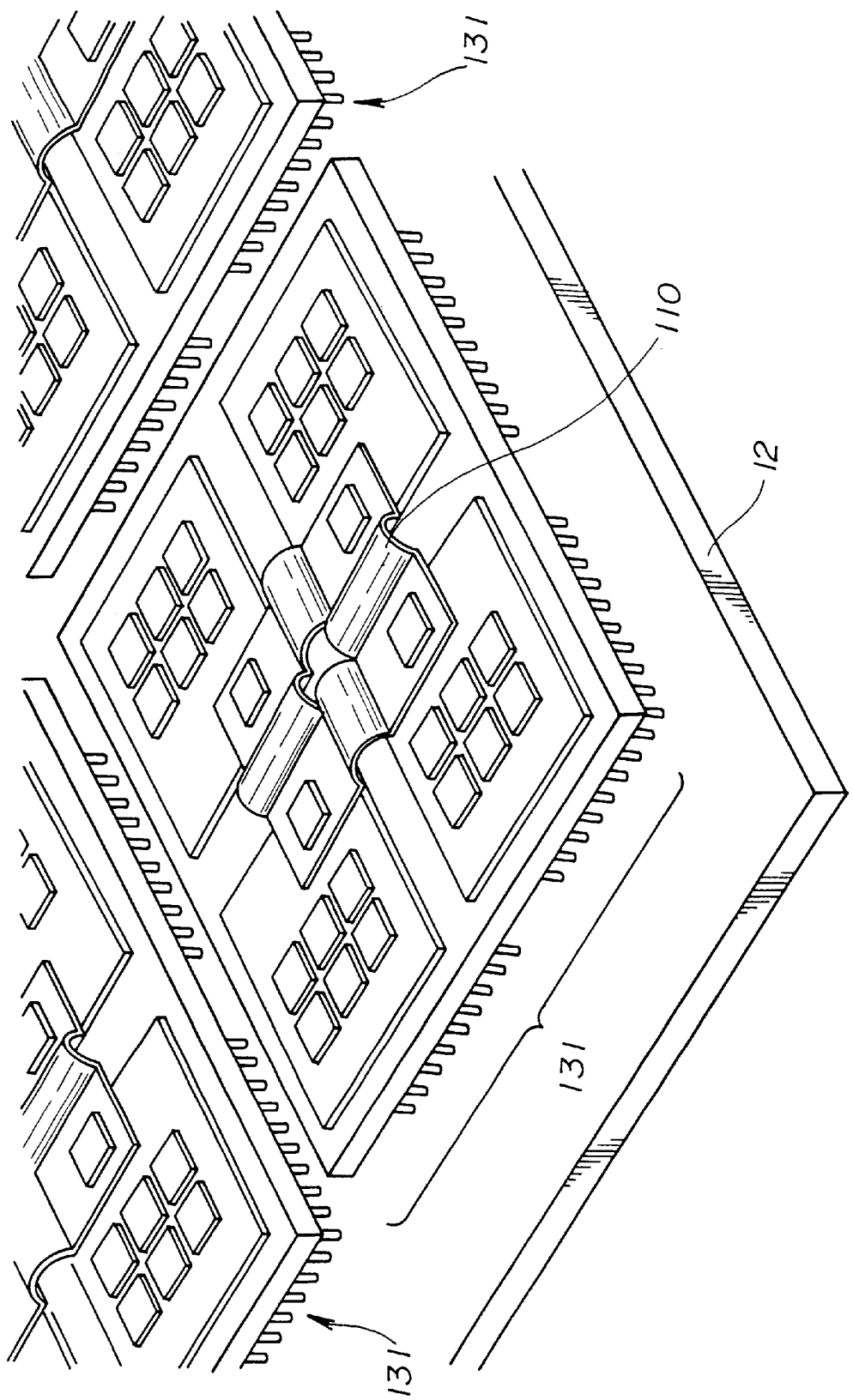
FIG. 17 is a perspective view of a part of a printed circuit-board unit according to a sixth embodiment of the present invention.

A description will now be given, with reference to FIG. 17, of a sixth embodiment of the present invention. FIG. 17 is a perspective view of a part of a printed circuit-board unit according to the sixth embodiment of the present invention.

The printed circuit-board unit shown in FIG. 17 comprises the mother board 12 and a plurality of the combination modules 131 shown in FIG. 14. The combination modules 131 may be connected to each other by a flexible wiring board having the same structure as that of the flexible wiring boards according to the first to fifth embodiment of the present invention.

It should be noted that, in the above-mentioned embodiments, the flexible wiring board is used to avoid a problem caused by a positional offset of the MCMs. However, a rigid wiring board may be used if a stress generated in the connecting parts due to a positional offset of the MCMs can be avoided by the connecting structure between the rigid wiring board and the motherboard.

The present invention is not limited to the specifically disclosed embodiments, and variations and modifications may be made without departing from the scope of the present invention.

The present application is based on Japanese priority application No. 11-146657 filed on May 26, 1999, the entire contents of which are hereby incorporated by reference.

What is claimed is:

1. A semiconductor device comprising:
    a first multi-chip module having a plurality of functional parts mounted on a first rigid circuit board;
    a second multi-chip module having a plurality of functional parts mounted on a second rigid circuit board;
    a flexible wiring board connecting the first multi-chip module to the second multi-chip module; and
    an interface part mounted on the flexible wiring board, the interface part controlling input and output signals of the first multi-chip module.

2. The semiconductor device as claimed in claim 1, wherein a connecting portion of the flexible wiring board is connected to the first multi-chip module by being mounted to the circuit board of the first multi-chip module so that the interface part is mounted on the connecting portion of the flexible wiring board, a terminal of the first multi-chip module being electrically connected to a wiring pattern of the first multi-chip module through the flexible wiring board.

3. The semiconductor device as claimed in claim 2, wherein the terminal of the first multi-chip module is electrically connected to the wiring pattern of the first multi-chip module by a via formed in the flexible wiring board.

4. The semiconductor device as claimed in claim 1, further comprising a third multi-chip module having a plurality of functional parts mounted on a circuit board, wherein the flexible wiring board connects the first multi-chip module to both the second multi-chip module and the third multi-chip module.

5. The semiconductor device as claimed in claim 4, wherein the flexible wiring board has a first portion extending from the first multi-chip to the second multi-chip module and a second portion extending from the first multi-chip module to the third multi-chip module.

6. The semiconductor device as claimed in claim 1, further comprising a third multi-chip module and a fourth multi-chip module, wherein the flexible wiring board has a substantially square shape so that four corners of the flexible wiring board are connected to the first, second, third and fourth multi-chip modules, respectively.

7. The semiconductor device as claimed in claim 6, wherein the flexible wiring board has a structure to absorb a positional offset of each of the first, second, third and fourth multi-chip modules.

8. The semiconductor device as claimed in claim 7, wherein the structure to absorb a positional offset includes a square opening formed in the center of the flexible wiring board.

9. The semiconductor device as claimed in claim 7, wherein the structure to absorb a positional offset includes a cross-shaped slit formed in the center of the flexible wiring board.

10. The semiconductor device as claimed in claim 7, further comprising a frame retaining the first, second, third and fourth multi-chip modules in a predetermined positional relationship.

11. A printed circuit-board unit comprising:
   a motherboard; and
   a semiconductor device mounted on the motherboard, the semiconductor device comprising:
      a first multi-chip module having a plurality of functional parts mounted on a first rigid circuit board;
      a second multi-chip module having a plurality of functional parts mounted on a second rigid circuit board;
      a flexible wiring board connecting the first multi-chip module to the second multi-chip module; and
      an interface part mounted on the flexible wiring board, the interface part controlling input and output signals of the first multi-chip module.

12. A semiconductor device comprising:
   a plurality of multi-chip modules each having a plurality of functional parts mounted on a rigid circuit board;
   a flexible wiring board connecting the multi-chip modules to each other; and
   an interface part mounted on the wiring board, the interface part controlling input and output signals of each of the multi-chip modules.

13. A printed circuit-board unit comprising:
   a motherboard; and
   a semiconductor device mounted on the motherboard, the semiconductor device comprising:
      a plurality of multi-chip modules each having a plurality of functional parts mounted on a rigid circuit board;
      a flexible wiring board connecting the multi-chip modules to each other; and
      an interface part mounted on the wiring board, the interface part controlling input and output signals of each of the multi-chip modules.

* * * * *